United States Patent [19]

Clark

[11] Patent Number: 4,554,615

[45] Date of Patent: Nov. 19, 1985

[54] ELECTRICALLY CONDUCTING PANEL AND METHOD OF MAKING SAME

[75] Inventor: Ralph Clark, Carson, Calif.

[73] Assignee: Bussco Engineering, Inc., El Segundo, Calif.

[21] Appl. No.: 500,035

[22] Filed: Jun. 1, 1983

[51] Int. Cl.[4] .......................... H05K 1/11; H02G 5/00
[52] U.S. Cl. .................................. 361/412; 361/355; 174/72 B
[58] Field of Search ............... 361/401, 412, 414, 341, 361/342, 355; 174/52 FP; 357/69, 70, 71; 29/827, 877, 883

[56] References Cited

U.S. PATENT DOCUMENTS

| | | | |
|---|---|---|---|
| 3,400,303 | 9/1968 | Rowlands et al. | 361/355 |
| 3,628,095 | 12/1971 | Schwartz et al. | 174/72 B X |
| 3,670,205 | 6/1972 | Dixon et al. | 361/401 X |
| 3,708,609 | 1/1973 | Iosue et al. | 174/72 B |
| 3,893,233 | 7/1975 | Glover | 29/877 X |
| 3,961,129 | 6/1976 | Gehrs et al. | 174/72 B |
| 3,995,103 | 11/1976 | Gehrs et al. | 174/72 B |
| 4,281,361 | 7/1981 | Patz et al. | 361/401 |

FOREIGN PATENT DOCUMENTS 1246836 8/1967 Fed. Rep. of Germany ...... 361/414

*Primary Examiner*—Vit W. Miska
*Attorney, Agent, or Firm*—Jack C. Munro

[57] ABSTRACT

An electrical conducting panel and method of making such which is constructed of an integral sheet material housing. Extending out of the plane of the housing are a plurality of electrically connecting plugs which are to electrically connect with appropriate electrical connectors of a separate electrical panel. The housing is constructed of a stacked plurality of electrical conducting frame members and a plurality of electrically insulating plates. Included within the housing are a plurality of electrically insulating inserts, each of which is positioned at a selected location. The housing includes a plurality of openings through which are to extend electronic components which are mounted on the circuit board to which the panel is connected. After the panel is completely assembled, it is heated under pressure which results in the electrical insulative plates and inserts fusing together into an integral unit.

2 Claims, 6 Drawing Figures

ELECTRICALLY CONDUCTING PANEL AND METHOD OF MAKING SAME

BACKGROUND OF THE INVENTION

In the manufacture of electrical equipment, it is common to require a panel or grid, to provide a path for the electricity to and from the electronic equipment. In the past, it has been common to construct a grid or panel to facilitate the connection of the electrical or electronic components to a circuit path. The use of these panels is a definite improvement, both in quality of the electrical connection and in the time involved in making the electrical connection, over individual wiring of the components to a source of electricity.

However, such grids or panels require a substantial amount of filling of openings in the panel with a potting compound. This means that the manufacturing of such grids and panels has been quite labor intensive and therefore, inherently high in manufacturing cost.

It would be desirable to construct such a grid or panel in a manner to minimize labor of manufacture and thereby decrease manufacturing cost. It would also be desirable to construct the panel in such a way to maximize the quality of the electrical connection.

SUMMARY OF THE INVENTION

The panel, or grid, of the present invention is formed as a single sheet material rigid housing which has formed therein a mass of enlarged openings located in a side-by-side relationship. When the panel or grid is mounted in its desired location, there will be located within each enlarged opening a mass of electrical components. Located within each enlarged opening is a pair of electrical connectors representing a positive connecting terminal and a negative connecting terminal. The positive and negative electrical connecting terminals are to be electrically wired to supply electricity to the components located within its particular enlarged opening. Each of the positive electrical connectors is connected to an electrically conductive frame. In a similar manner, the negative electrical connectors are formed as part of a second electrically conducting frame. The frames are mounted in a stacked relationship in respect to each other with an electrically insulative plate located therebetween. Similar electrically insulative plates cover the bottom surface and the top surface of the panel. Located about the periphery of each of the frames are a plurality of electrically insulative inserts which are shaped to matingly correspond to the area within which it is located. The outer edge of each of the inserts is aligned with the outer edge of the resulting panel. An adhesive has been applied to the stacked arrangement of plates and frames. The resulting panel, or grid, is heated under pressure to approximately three hundred and fifty degrees Fahrenheit, which causes fusing together of the electrically insulative parts to form an integral unit. Electrical connecting plugs are connected to each of the frames and extend laterally from the panel. These plugs facilitate connection to the electrical apparatus to which it is mounted. The major portion of each enlarged opening is closed by an insert during the forming of the panel. After the forming of the panel, the insert is to be removed by conventional removing techniques, such as routing. Any portion of the enlarged opening which is still open and not completely closed to the ambient is then to be closed through the use of a liquid potting material which will ultimately harden.

DETAILED DESCRIPTION OF THE SHOWN EMBODIMENT

Referring particularly to the drawings, there is shown the panel 10 of this invention which is basically of a rectangular shape and sheet material in construction. The panel 10 is substantially rigid. Formed within the panel 10 are a plurality of enlarged openings 12. It is to be noted that there are twenty in number of the openings shown. However, it is to be understood that this number could be increased or decreased.

Figure 2:
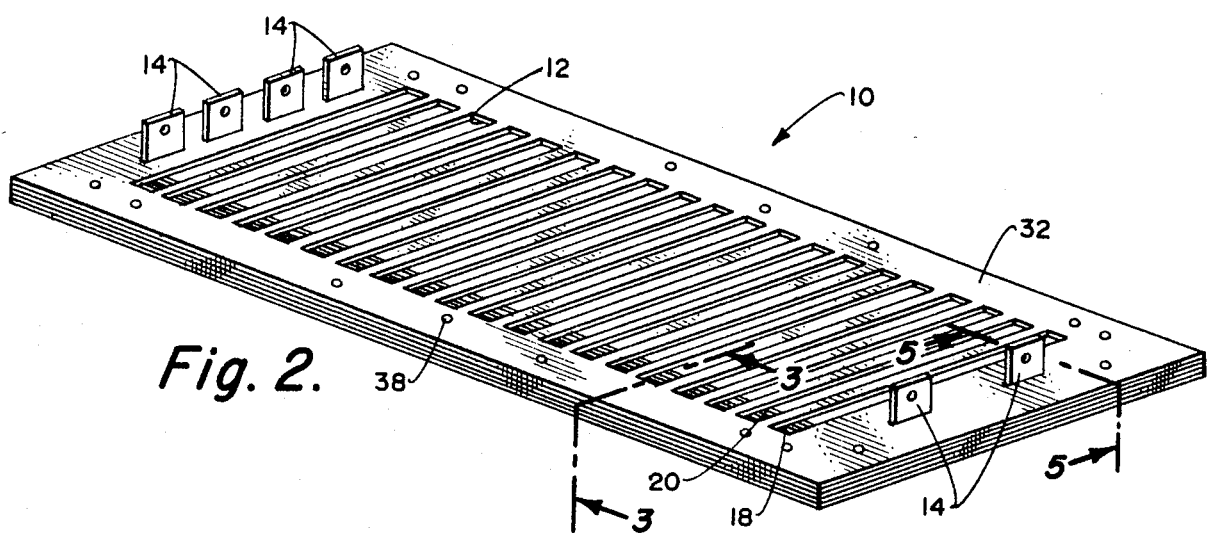
FIG. 2 is an isometric view showing a completed panel of this invention.
Figure 3:
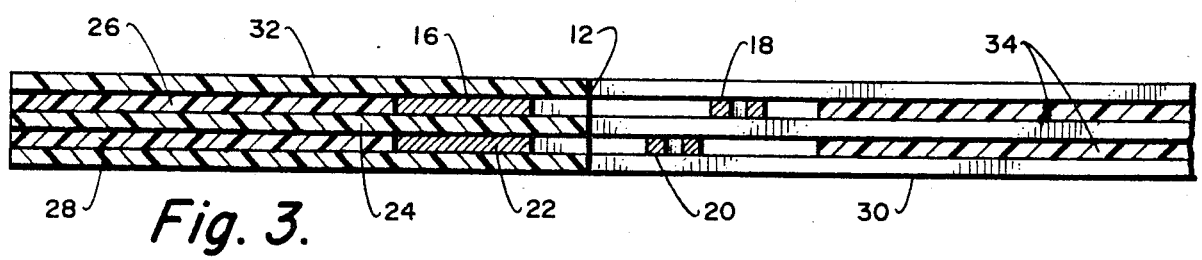
FIG. 3 is a cross-sectional view taken along line 3—3 of FIG. 2.
Figure 4:
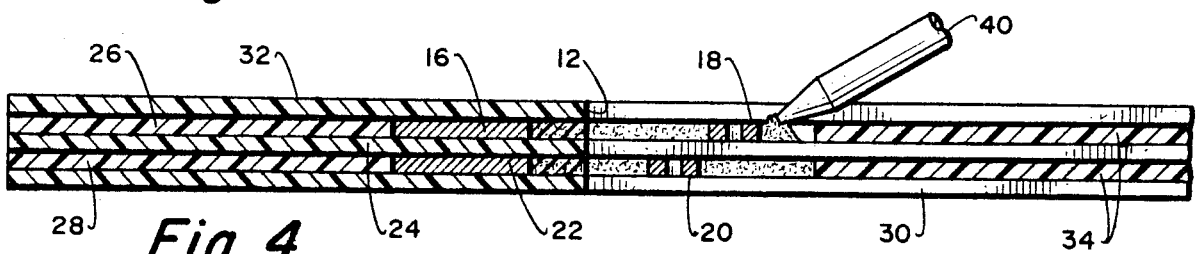
FIG. 4 is a view similar to FIG. 3 but depicting the potting operation to close to the ambient a portion of an edge of one of the enlarged openings included within the panel of the present invention.
Figure 5:
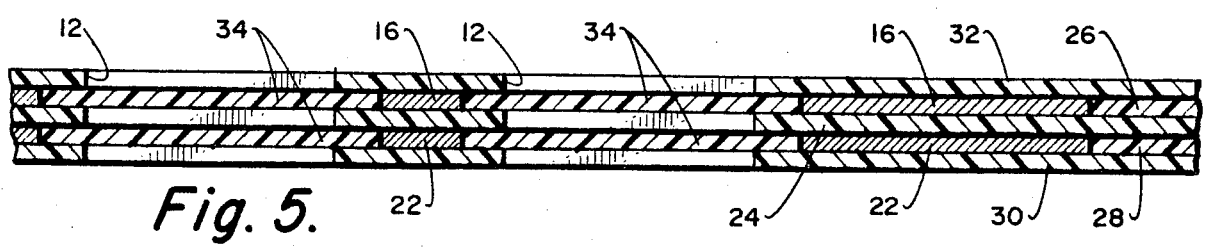
FIG. 5 is a cross-sectional view taken along line 5—5 of FIG. 2.
Figure 6:
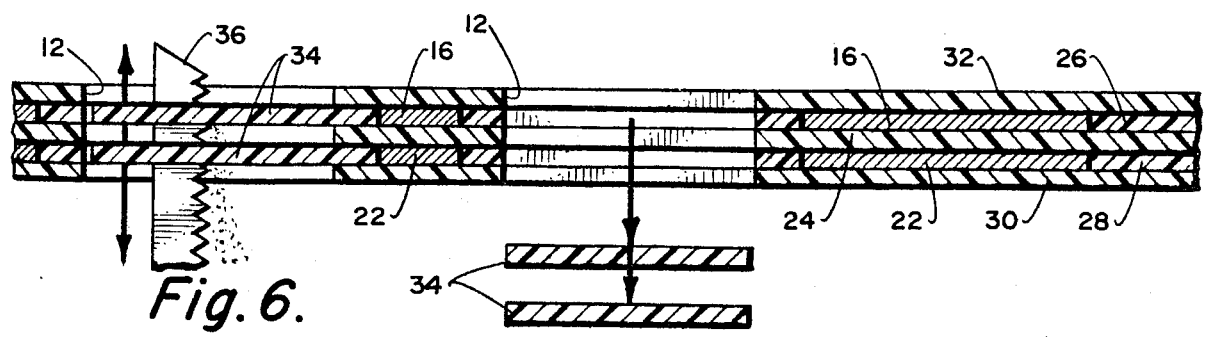
FIG. 6 is a view similar to FIG. 5 depicting the removing of one of the inserts which substantially closes off an enlarged opening during the forming of the panel of the present invention.

Extending laterally, or above the surface of the panel 10, are plugs 14. The plugs 14 are to electrically connect with a separate structure (not shown). It is to be noted that in reference to FIG. 2, there are shown six in number of the plugs 14. Three in number of the plugs 14 are to extend from a frame 16 which is electrically conductive. The frame 16 has openings which align with the openings 12. Normally the frame 16 will be constructed of aluminium or copper.

Located within one end of each opening 12 of the frame 16 is an electrical connector 18. The connector 18 extends across the opening 12. Each connector 18 is to be electrically connected to an electrical connection of a grouping of electrical components which will be located within its respective opening 12. These components are not shown.

Figure 1:
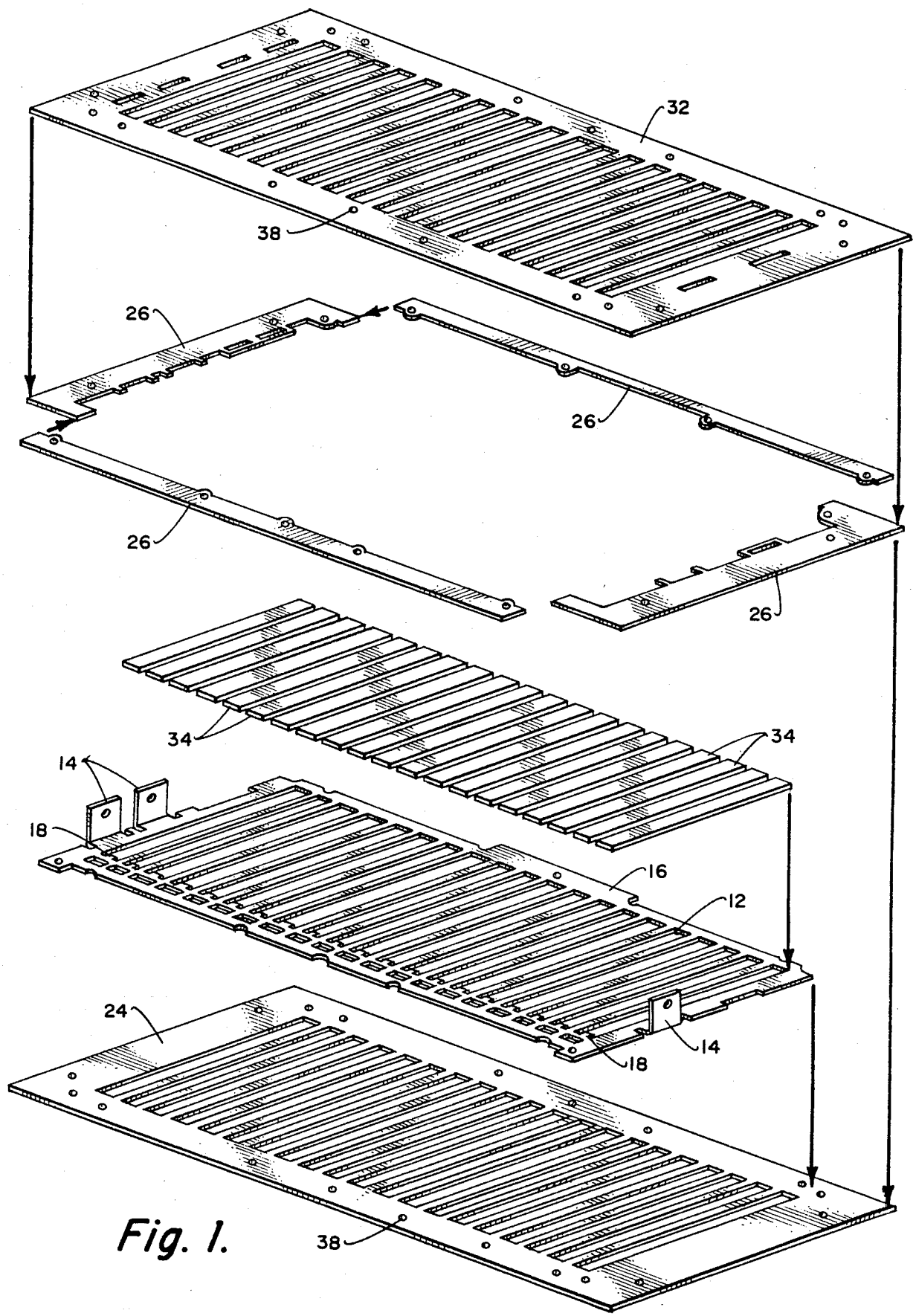
FIG. 1 is an exploded, isometric view showing the constructural arrangement of a portion of a panel which has been constructed in accordance with this invention.

The remaining three plugs 14 are attached to a frame 22 which is basically identical to frame 16 except for the position of the plugs 14. The frames 16 and 22 are located in a stacked relationship with respect to each other with an electrically insulating plate 24 located therebetween. The plate 24 will normally be constructed of a fiberglass or other similar type of material. The plate 24 includes enlarged openings which align with the openings 12. For illustrative purposes, the frame 22 is not shown in FIG. 1.

It is to be noted that the peripheral edge of the frame 16 is spaced inwardly of the peripheral edge of the plate 24. Within this spacing, there is to be located a plurality of specially configured electrically insulating inserts 26. There is to be an insert 26 for each end of frame 16 and also an insert 26 for the top and bottom edges of the frame 16. The inserts 26 will normally be constructed of the same material as the plate 24. With the inserts 26 in position, the outer edge of each insert 26 is in alignment with the outer edge of the plate 24. At the same time, the inner surface of each insert 26 closely conforms to the portion of the outer edge 16 to which it abuts. It is to be noted that there will be similar inserts 28 located about the frame 22. In reference to FIG. 1, the inserts 28, as well as frame 22, are not shown since it is understood that these constitute a mere duplication of frame 16 and inserts 26.

The lower surface of the frame 22 rests against a plate 30. Plate 30 is basically similar in configuration to plate 24. Plate 30 is referred to as the bottom plate. There is to be utilized a top plate 32 located against the upper surface of the frame 26 and 28. The top plate 32 is basically identical in configuration to the plate 30.

During the forming of the panel 10, there is to be an insert 34 located within each opening 12 extending almost the entire length of the opening 12 but not being able to do so due to the electrical connectors 18 and 20. The inserts 34 are constructed of a material similar to the constructing of the inserts 26.

Prior to the assemblying of the different parts of the panel 10 in their stacked relationship, the parts are coated with an adhesive (not shown). After the panel 10 has been completely assembled, the panel 10 is to be located within an oven generating a temperature of approximately three hundred and fifty degrees Fahrenheit. The panel 10 is also to be located within a mold and a pressure applied to the panel 10. The combination of the heat and the pressure will result in an integral fusing of the electrically insulative members about the frames 16 and 22.

After completing the fusing, the panel 10 is removed from the heated environment and permitted to cool to room temperature. It is desirable to open each of the openings 12, which at this time, are closed by the inserts 34. To achieve this, each of the inserts 34 is removed by an appropriate cutting tool 36. The edges of each of the inserts 34 will remain fused within the housing of the panel 10. This will mean that the edges of each of the openings 12 of the frames 16 and 22 are closed in respect to the ambient.

However, in the area of the connectors 18 and 20, there is a small slot formed connecting with the frames 16 and 22 since the insert 34 does not extend within this area of the opening 12. The procedure at this time is to apply a liquid resin within this slot thereby closing these areas. The liquid resin will normally be applied by a nozzle 40 from a supply of such resin (not shown). The panel 10 is now ready for use.

It is to be noted that within the housing of the panel 10, there is located a series of holes 38. The holes 38 are to function to connect with fasteners (not shown) to mount the panel 10 at its desired location.

What is claimed is:

1. The method of making an electrically conducting panel comprising the steps of:

utilizing a pair of electrically conductive frames with each frame having at least one pair of electrically connecting plugs and each frame having a plurality of spaced apart enlarged openings;

locating the lower surface of one of said frames against a sheet material, electrically insulative, base section wherein the peripheral edge of said base section extends exteriorly of the peripheral edge of said one frame;

placing a plurality of sheet material, electrically insulative, inserts about the periphery of said one frame wherein each insert has an inner edge configuration closely conforming to the portion of said one frame that it abuts and the outer edge of each said insert is in alignment with the peripheral edge of said base section;

placing an electrically insulative insert within each enlarged opening substantially closing such;

locating a sheet material, electrically insulative, center cover on the upper surface of said one frame substantially completely covering same with the peripheral edge of said center cover being aligned with the peripheral edge of said base section;

placing the other frame of said pair of frames on said center cover;

placing a plurality of sheet material electrically insulative, inserts about the periphery of said other frame in a manner similar to the above first placing step and inserts within each enlarged opening in a manner similar to the above second placing step;

locating a sheet material, electrically insulative, top cover on said other frame substantially completely covering same with the peripheral edge of said top cover being aligned with the peripheral edge of said center cover;

bonding together entire assemblage of parts to form an integral unit resulting in said panel; and physically removing most of each insert located within each enlarged opening leaving intact the edge of each insert forming a continuous, electrically insulative, smooth wall surface for each enlarged opening.

2. The method as defined in claim 1 wherein the step of bonding includes applying an adhesive to the different parts and then applying to the assembled structure heat and pressure to result in the bonding together of the different parts.

* * * * *